(12) United States Patent
Yamanaka et al.

(10) Patent No.: US 11,416,108 B2
(45) Date of Patent: Aug. 16, 2022

(54) DISPLAY DEVICE

(71) Applicant: SHARP KABUSHIKI KAISHA, Sakai (JP)

(72) Inventors: Masaki Yamanaka, Sakai (JP); Yi Sun, Sakai (JP); Masahiko Miwa, Sakai (JP); Takao Saitoh, Sakai (JP); Yohsuke Kanzaki, Sakai (JP); Seiji Kaneko, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/258,442

(22) PCT Filed: Jul. 25, 2018

(86) PCT No.: PCT/JP2018/027891
§ 371 (c)(1),
(2) Date: Jan. 7, 2021

(87) PCT Pub. No.: WO2020/021654
PCT Pub. Date: Jan. 30, 2020

(65) Prior Publication Data
US 2021/0271336 A1    Sep. 2, 2021

(51) Int. Cl.
*G06F 3/047* (2006.01)
*G06F 3/041* (2006.01)
(Continued)

(52) U.S. Cl.
CPC ............ *G06F 3/047* (2013.01); *G06F 3/0412* (2013.01); *H01L 27/323* (2013.01);
(Continued)

(58) Field of Classification Search
CPC ..... G06F 3/047; G06F 3/0412; H01L 27/323; H01L 27/3244; H01L 51/5253; H01L 51/56
(Continued)

(56) References Cited

U.S. PATENT DOCUMENTS

2005/0258441 A1    11/2005  Shitagami
2008/0309232 A1*   12/2008  Yamamoto .......... H01L 51/5265
                                                              313/505

(Continued)

FOREIGN PATENT DOCUMENTS

JP          2006004907 A        1/2006

*Primary Examiner* — Prabodh M Dharia
(74) *Attorney, Agent, or Firm* — ScienBiziP, P.C.

(57) ABSTRACT

A display device includes a display area and a frame area surrounding the display area. The display device comprises a TFT layer, a light-emitting element layer, a sealing layer including a first inorganic sealing film, an organic sealing film, and a second inorganic sealing film, a bank coated with the first inorganic sealing film and the second inorganic sealing film, a touch panel function layer, and a plurality of touch panel wires running to intersect with the bank in planar view and connected to the touch panel function layer. The second inorganic sealing film includes a bank coating that coats an upper face of the bank, and a protrusion, in a clearance between neighboring two of the plurality of touch panel wires, protrudes from the bank coating toward the display area or away from the display area.

20 Claims, 14 Drawing Sheets

(51) Int. Cl.
　　　*H01L 27/32*　　　(2006.01)
　　　*H01L 51/52*　　　(2006.01)
　　　*H01L 51/56*　　　(2006.01)
(52) U.S. Cl.
　　　CPC ...... *H01L 27/3244* (2013.01); *H01L 51/5253* (2013.01); *H01L 51/56* (2013.01); *H01L 2227/323* (2013.01)
(58) Field of Classification Search
　　　USPC .......................................... 345/173; 313/505
　　　See application file for complete search history.

(56) References Cited

U.S. PATENT DOCUMENTS

| | | | |
|---|---|---|---|
| 2017/0207276 A1* | 7/2017 | Miyamoto | H01L 27/3276 |
| 2021/0265429 A1* | 8/2021 | Yamanaka | H01L 27/323 |
| 2021/0296425 A1* | 9/2021 | Ochi | H01L 51/5253 |

* cited by examiner

DISPLAY DEVICE

TECHNICAL FIELD

The present disclosure relates to a display device.

BACKGROUND ART

In recent years, light-emitting organic electroluminescence (EL) display devices using organic EL elements are drawing attention as a replacement for liquid crystal display devices. Of these organic EL display devices, ones including a touch panel are proposed (e.g., Patent Document 1). That is, a typical organic EL display device includes a touch panel body (a touch panel function layer) provided on a display area. A touch panel wire connected to the touch panel body is routed from the display area to a terminal, and then connected to a detection circuit via the terminal. Such a structure makes it possible to detect a user operation of the touch panel.

CITATION LIST

Patent Literature

[Patent Document 1] Japanese Unexamined Patent Application Publication No. 2006-004907

SUMMARY

Technical Problem

In the typical organic EL display device described above, a thin-film sealing layer seals a light-emitting element layer (an organic EL layer) provided on a substrate, in order to keep the light-emitting element layer from deteriorating. Moreover, the thin-film sealing layer is an organic sealing film to be applied by, for example, an ink-jet technique. The typical organic EL display device includes a bank (a stemming wall) shaped into a frame to surround the display area, and the bank defines an end of the organic sealing film.

The typical organic EL display device would, however, poses a problem as follows: when the touch panel is provided on the thin-film sealing layer; that is, when the touch panel is provided in an on-cell configuration, the touch panel wire and the bank intersect with each other, and the intersection short-circuits the neighboring touch panel wires.

In view of the above problem, the present disclosure is intended to provide a display device a touch panel of which is provided in an on-cell configuration while neighboring touch panel wires can be kept from a short circuit.

Solution to Problem

A display device according an aspect of the present disclosure includes a display area and a frame area surrounding the display area. The display device includes: a light-emitting element layer formed above the TFT layer; a sealing layer formed above the light-emitting element layer, and including a first inorganic sealing film, an organic sealing film, and a second inorganic sealing film stacked on top of an other in a stated order; a bank formed to surround the display area, and coated with the first inorganic sealing film and the second inorganic sealing film; a touch panel function layer formed above the sealing layer; and a plurality of touch panel wires formed above the sealing layer, running to intersect with the bank in planar view, and connected to the touch panel function layer. The second inorganic sealing film includes: a bank coating coating an upper face of the bank; and a protrusion in a clearance between neighboring two of the touch panel wires. The protrusion protrudes from the bank coating toward the display area or away from the display area.

Advantageous Effects

An aspect of the present disclosure can keep neighboring touch panel wires from a short circuit.

BRIEF DESCRIPTION OF DRAWINGS

FIG. 3(a) is a plan view schematically illustrating a step of forming a sealing layer, and FIG. 3(b) is a plan view schematically illustrating a step of forming the touch panel wires.

FIG. 5(a) is a plan view schematically illustrating a step of forming a sealing layer, and FIG. 5(b) is a plan view schematically illustrating a step of forming the touch panel wires.

FIG. 9(a) is a plan view schematically illustrating a step of forming a sealing layer, and FIG. 9(b) is a plan view schematically illustrating a step of forming the touch panel wires.

FIG. 12(a) is a plan view schematically illustrating a step of forming a sealing layer, and FIG. 12(b) is a plan view schematically illustrating a step of forming the touch panel wires.

FIG. 14(a) is a plan view schematically illustrating a step of forming a sealing layer, and FIG. 14(b) is a plan view schematically illustrating a step of forming the touch panel wires.

DESCRIPTION OF EMBODIMENTS

In the description below, the term "same layer" means that constituent features are formed in the same process (in the same film forming process). The term "lower layer (or layer below)" means that a constituent feature is formed in a previous process before a comparative layer is formed. The term "upper layer (or layer above)" means that a constituent feature is formed in a successive process after a comparative layer is formed.

(Display Device)

Figure 1:
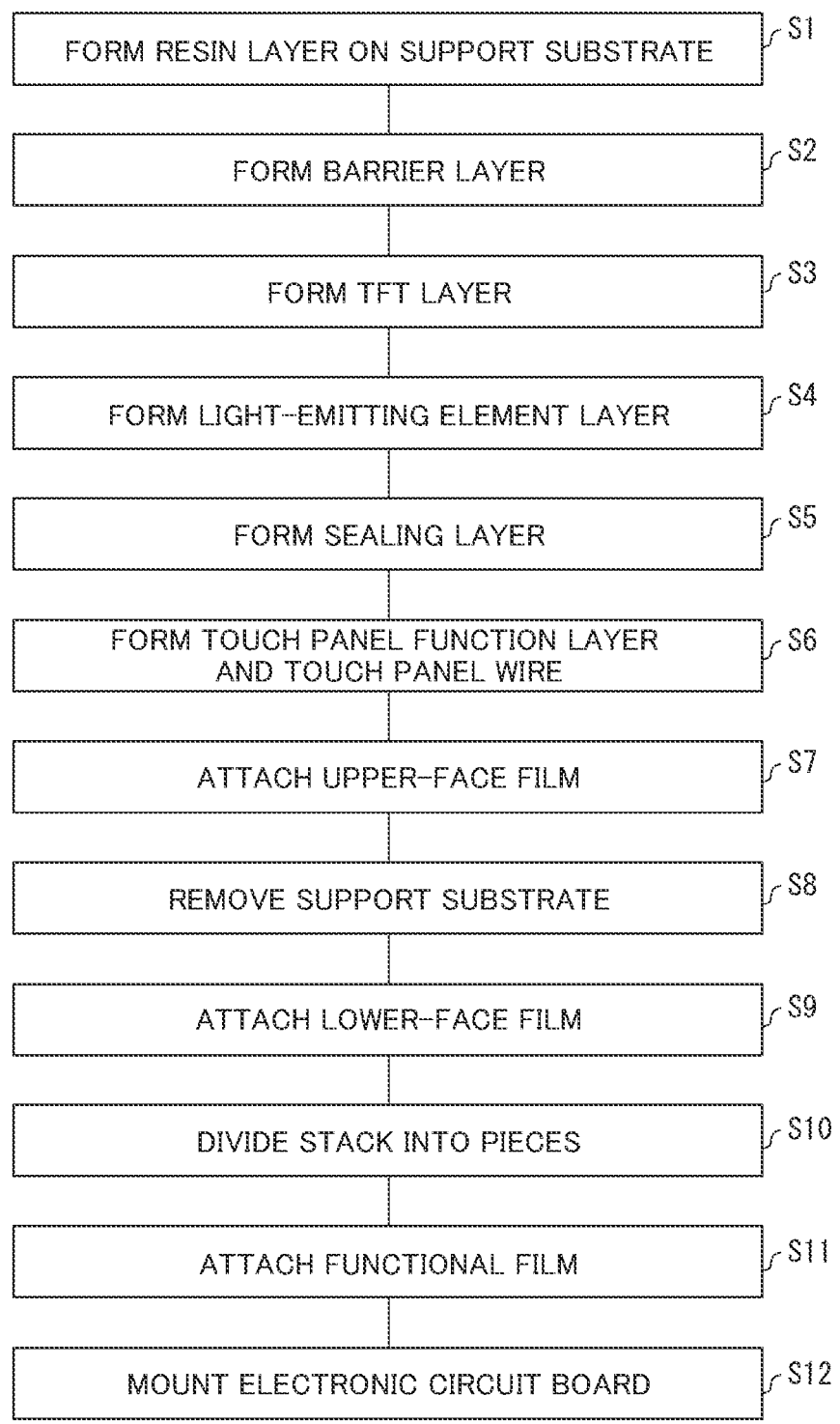
FIG. 1 is a flowchart showing an example of a method for manufacturing a display device.

FIG. 1 is a flowchart showing an example of a method for manufacturing a display device 2. FIG. 2(a) is a cross-section illustrating a configuration example of the display device 2 in a manufacturing process, and FIG. 2(b) is a cross-section illustrating a configuration example of the display device 2.

Figure 2:
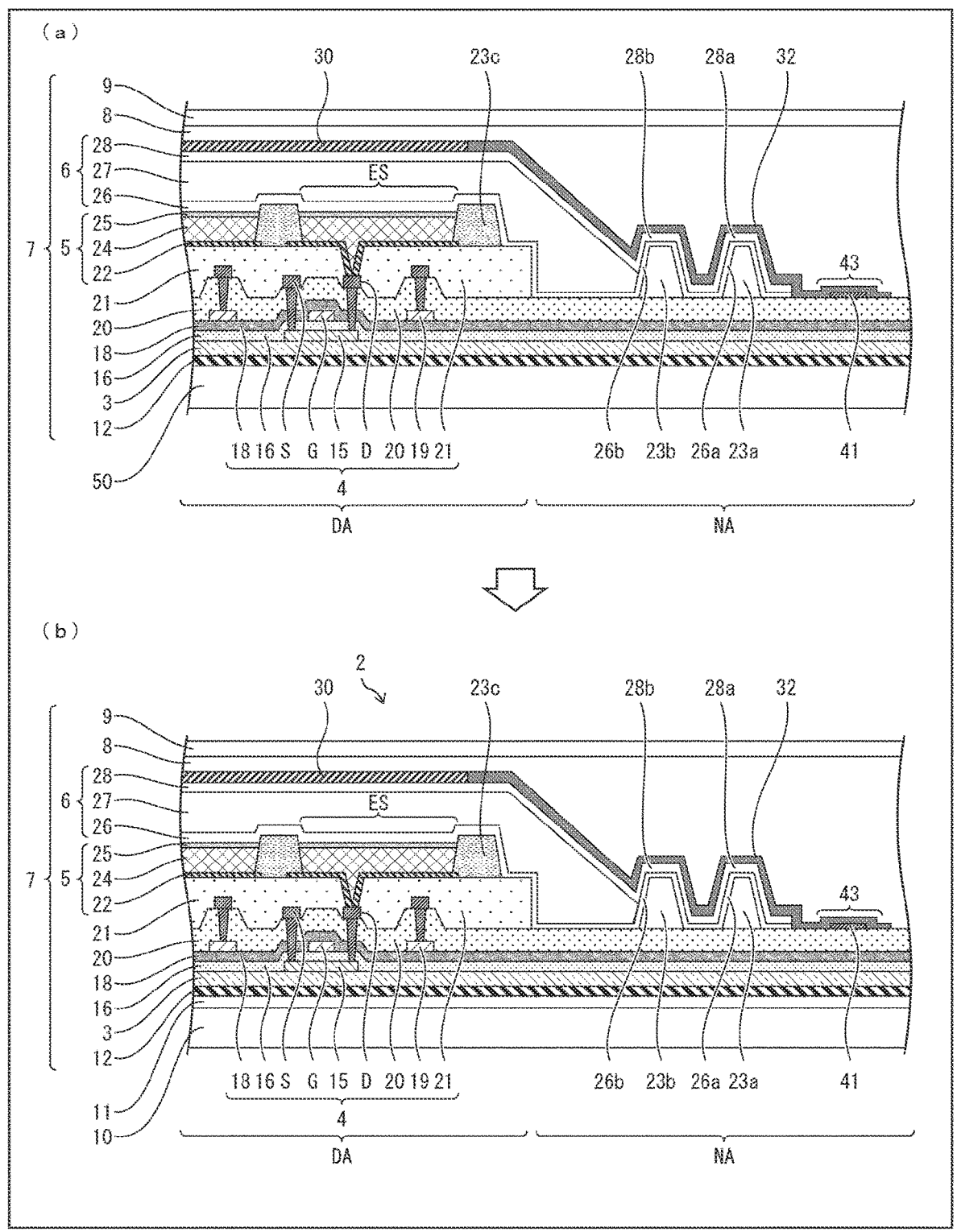
FIG. 2(a) is a cross-section illustrating a configuration example of the display device in a manufacturing process.
FIG. 2(b) is a cross-section illustrating a configuration example of the display device.

In producing a flexible display device, first, as illustrated in FIGS. 1 and 2, a resin layer 12 is formed on a translucent support substrate 50 (e.g., a mother glass) (Step S1). Next, an inorganic barrier layer 3 is formed (Step S2). Next, a thin-film transistor (TFT) layer 4 is formed (Step S3). Next, a light-emitting device layer 5 of a top emission type is formed (Step S4). Next, a sealing layer 6 is formed (Step S5). Next, a touch panel function layer 30 and touch panel wires 32 are formed (Step S6). Next, an upper-face film 9 is attached through a bonding layer 8 above the sealing layer 6, the touch panel function layer 30, and the touch panel wires 32 (Step S7).

Next, the support substrate 50 is removed from the resin layer 12 with, for example, a laser beam emitted on the support substrate 50 (Step S8). Next, on a lower face of the resin layer 12, a lower-face film 10 is attached through a bonding layer 11 (Step S9). Next, a stack 7 including the lower-face film 10, the resin layer 12, the inorganic barrier layer 3, the TFT layer 4, the light-emitting device layer 5, and the sealing layer 6 is separated into a plurality of pieces (Step S10). Next, to each of the obtained pieces, a functional film 39 is attached (Step S11). Next, an electronic circuit board (e.g., an IC chip and a flexible printed circuit, or FPC) is mounted on a part of a frame area (a non-display area) NA outside a display area DA in which a plurality of sub-pixels are formed (Step S12). Note that Steps S1 to S12 are executed by a display device production apparatus (including a deposition apparatus executing each of Steps S1 to S6).

The resin layer 12 is made of, for example, polyimide. The resin layer 12 may be replaced with a double-layer resin film (e.g., a polyimide film), and with an inorganic insulating film sandwiched between the layers of the resin film.

The inorganic barrier layer 3 prevents such foreign objects as water and oxygen from reaching the TFT layer 4 and the light-emitting element layer 5. An example of the barrier layer 3 includes a silicon oxide film, a silicon nitride film, or a silicon oxide nitride film formed by the chemical-vapor deposition (CVD), or a multilayer film including those films.

The TFT layer 4 includes: a semiconductor film 15; an inorganic insulating film 16 (a gate insulating film) 16 above the semiconductor film 15; a gate electrode G and a gate wire above the inorganic insulating film 16; an inorganic insulating film 18 above the gate electrode G and the gate wire; a wire 19 above the inorganic insulating film 18; an inorganic insulating film 20 above the wire 19; a source electrode S and a source wire above the inorganic insulating film 20; and a planarization film 21 above the source electrode S and the source wire.

The semiconductor film 15 is formed of, for example, low-temperature polysilicon (LTPS) or an oxide semiconductor (e.g., an In—Ga—Zn—O-based semiconductor). A thin-film transistor (TFT) is formed to contain the semiconductor film 15 and the gate electrode G. In FIG. 2, the illustrated TFT is a top-gate TFT. Alternatively, the TFT may be a bottom-gate TFT.

The gate electrode G, the gate wire, the wire 19, the source electrode S, and the source wire are each formed of a metal monolayer film or a metal multilayer film including at least one of aluminum, tungsten, molybdenum, tantalum, chromium, titanium, and copper. The TFT layer 4 in FIG. 2 includes a monolayer semiconductor layer and a three-layer metal layer.

The inorganic insulating films 16, 18, and 20 can be, for example, a silicon oxide (SiOx) film, or a silicon nitride (SiNx) film formed by the CVD, or a multilayer film including these films. The planarization film 21 may be made of an applicable organic material such as polyimide and acrylic.

The light-emitting element layer 5 includes: an anode 22 above the planarization film 21; an insulating cover film 23c covering an edge of the anode 22; an EL layer 24 above the cover film 23c; and a cathode 25 above the EL layer 24. The cover film 23c is formed of, for example, an organic material such as polyimide and acrylic. The organic material is applied, and then patterned by photolithography to form the cover film 23c.

For each of the sub-pixels, (i) the light-emitting element layer 5 includes a light-emitting element ES (e.g., an organic light-emitting diode (OLED) and a quantum dot light-emitting diode (QLED)) including the anode 22, the EL layer 24, and the cathode 25 each shaped into an island, and (ii) the TFT layer 4 includes a sub-pixel circuit controlling the light-emitting element ES.

The EL layer 24 includes a hole-injection layer, a hole-transport layer, a light-emitting layer, an electron-transport layer, and an electron-injection layer stacked on top of another in the stated order from below. The light-emitting layer is shaped into an island formed in an opening of the cover film 23c (for each sub pixel) by vapor deposition or an ink-jet method. The other layers are shaped into islands or a monolithic form. Moreover, the EL layer 24 may omit one or more of the hole-injection layer, the hole-transport layer, the electron-transport layer, and the electron-injection layer.

In vapor-depositing to form a light-emitting layer of the OLED, a fine metal mask (FMM) is used. The FMM is a sheet (e.g., invar) including many openings. Organic material passing through one opening forms a light-emitting layer (corresponding to one sub-pixel) shaped into an island.

A light-emitting layer of the QLED is formed of, for example, a solvent in which quantum dots are dispersed. The solvent is applied by an ink-jet technique to form the light-emitting layer (corresponding to one sub-pixel) shaped into an island.

The anode (a positive electrode) 22 is formed of, for example, a multilayer including: indium tin oxide (ITO) and Ag (silver); or ITO and an alloy including Ag. The anode 22 reflects light. The cathode electrode 25 can be formed of a translucent conductive material such as an MgAg alloy (an ultra-thin film), ITO, and indium zinc oxide (IZO).

If the light-emitting element ES is the OLED, holes and electrons recombine together in the light-emitting layer by a drive current between the anode 22 and the cathode 25, which forms an exciton. While the exciton transforms to the ground state, light is released. Since the cathode 25 is translucent and the anode 22 is light-reflective, the light emitted from the EL layer 24 travels upward. This is how the light-emitting element layer 5 is of a top emission type.

If the light-emitting element ES is the QLED, holes and electrons recombine together in the light-emitting layer by a drive current between the anode 22 and the cathode 25, which forms an exciton. While the exciton transforms from the conduction band level to the valence band level, light (fluorescence) is released.

In the light-emitting element layer 5, a light-emitting element (an inorganic light-emitting diode) other than the OLED and the QLED may be formed.

The sealing layer 6 is translucent, and includes: a first inorganic sealing film 26 covering the cathode 25; an organic sealing film 27 above the first inorganic sealing film 26; and a second inorganic sealing film 28 above the organic sealing film 27. The sealing layer 6 covering the light-emitting element layer 5 prevents such foreign objects as water and oxygen from penetrating into the light-emitting element layer 5.

The first and second inorganic sealing films 26 and 28 are both inorganic insulating films. An example of the first and second inorganic sealing films 26 and 28 includes a silicon oxide film, a silicon nitride film, or a silicon oxide nitride film formed by the CVD, or a multilayer film including those films. The organic sealing film 27 is a translucent organic film providing a planarized face. The organic sealing film 27 may be made of an applicable organic material such as acrylic. The organic sealing film 27, formed by application of a liquid organic material using an ink-jet technique, requires a first bank 23b and a second bank 23a.

The first bank 23b and the second bank 23a are formed in a frame area NA to surround a display area DA, and are coated with the first inorganic sealing film 26 and the second inorganic sealing film 28. The first bank 23b defines an end of the organic sealing film 27. Hence, the first bank 23b is formed to rise preferably above the planarization film 21 to be able to stem the organic material of the organic sealing film 27. The second bank 23a is provided to surround the first bank 23b. The second bank 23a is also formed to rise preferably above the planarization film 21. The first bank 23b and the second bank 23a may be formed in the same layer as the cover film 23c and as the planarization film 21. Alternatively, the first bank 23b and the second bank 23a may be stacked on the same layer as the planarization film 21 and as the cover film 23c. The first bank 23b has an upper face covered with a first coating 26b of the first inorganic sealing film 26, and with a first coating 28b of the second inorganic sealing film 28. The second bank 23a has an upper face covered with a second coating 26a of the first inorganic sealing film 26, and with a second coating 28a of the second inorganic sealing film 28.

The lower-face film 10 is attached to the lower face of the resin layer 12 after the support substrate is removed, in order to provide the display device with excellent flexibility. The lower-face film 10 is made of, for example, a polyethylene terephthalate (PET) film. The functional film 39 has at least one of such functions as optical compensation and protection.

The touch panel function layer 30 can be formed of either a non-translucent conductive material or a translucent conductive material such as an MgAg alloy (an ultra-thin film), ITO, and IZO. Moreover, the touch panel function layer 30 may be a multilayer including a plurality of conductive layers and an insulating layer sandwiched between the conductive layers. To the touch panel function layer 30, an end of each touch panel wire 32 is connected.

Each of the touch panel wires 32 may be, for example, a monolayer wire made of a single metal selected from a group including such metals as copper, aluminum, molybdenum, titanium, tantalum, and tungsten, or a multilayer wire made of two or more of the metals selected from the group. Preferably, the touch panel wire 32 is either (i) a multilayer wire made of titanium/aluminum/titanium, titanium/aluminum, or aluminum/titanium, or (ii) a monolayer wire made of aluminum. The touch panel wire 32 may be formed of, for example, a translucent conductive material such as ITO and IZO.

The touch panel wire 32 may be formed either (i) in the same layer as a wire or an electrode used for the touch panel function layer 30, or (ii) in a layer, different from the touch panel function layer 30, across an inorganic insulating film from the touch panel function layer 30. When formed in a layer different from the touch panel function layer 30, specifically, the touch panel wire 32 is formed either further above an inorganic insulating layer provided above the touch panel function layer 30, or further below an inorganic insulating layer provided below the touch panel function layer 30. In planar view, the touch panel wire 32 runs to intersect with the first bank 23b and the second bank 23a. Hence, the touch panel wire 32 runs on the second inorganic sealing film 28 to intersect with the first coating 28b and the second coating 28a of the second inorganic sealing film 28.

The frame area NA is provided with a terminal unit 43. At the terminal unit 43, each of the touch panel wires 32 is preferably connected to a routed wire formed in the same layer as any given wire used for the TFT layer 4. The routed wire includes a terminal 41 provided to the terminal unit 43. The terminal 41 is preferably coated directly with, and connected to, the touch panel wire 32. Moreover, the terminal unit 43 is preferably positioned out of an area in which the sealing layer 6 is formed in planar view.

Described above is a flexible display device. In the case where an inflexible display device is produced, steps such as forming a resin layer and replacing a base material are usually unnecessary. Hence, for example, the glass substrate undergoes stacking steps such as Steps S2 to S6, and then proceeds to Step S10.

Problem of Display Device in Comparative Example

Figure 3:
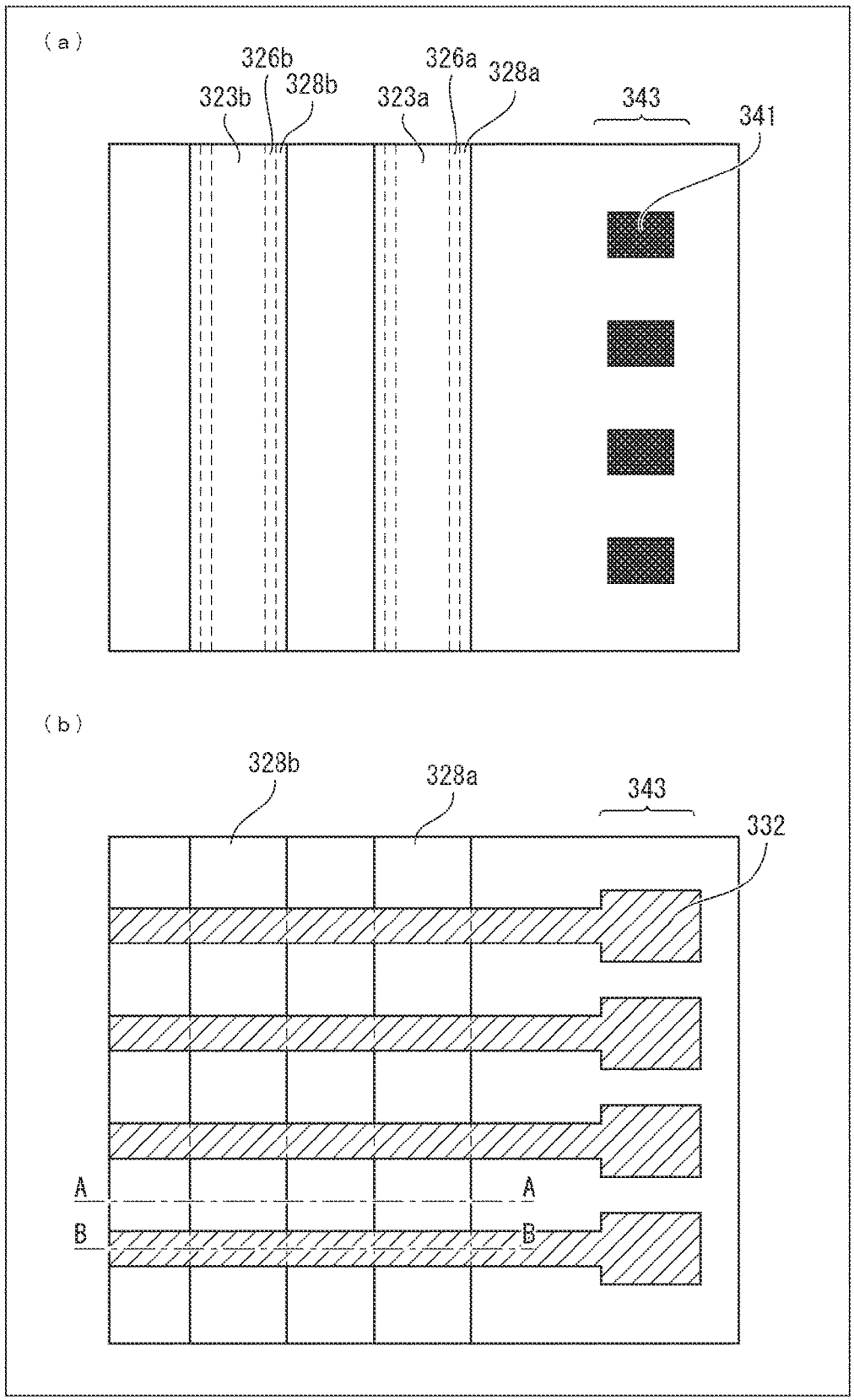
FIG. 3 is an illustration showing intersections, and their vicinities, of touch panel wires with a first bank and a second bank in a display device according to a comparative example.
Figure 4:
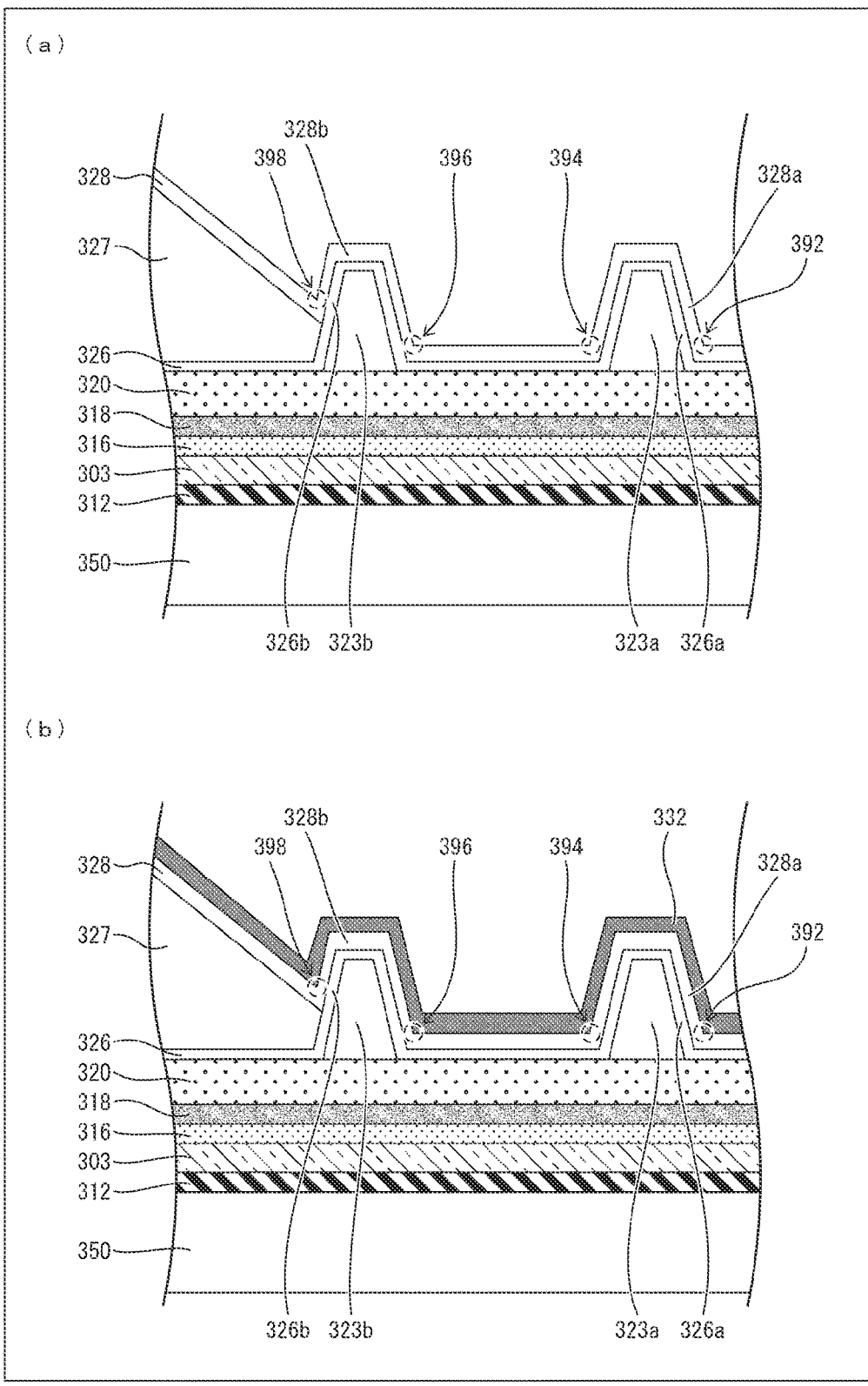
FIG. 4(a) is a cross-section taken along line A-A of FIG. 3(b)
FIG. 4(b) is a cross-section taken along line B-B of FIG. 3(b).

FIG. 3 is an illustration showing intersections, and their vicinities, of touch panel wires 332 with a first bank 323b and a second bank 323a in a display device according to a comparative example. FIG. 3(a) is a plan view schematically illustrating a step of forming a sealing layer, and FIG. 3(b) is a plan view schematically illustrating a step of forming the touch panel wires. FIG. 4(a) is a cross-section taken along line A-A of FIG. 3(b), and FIG. 4(b) is a cross-section taken along line B-B of FIG. 3(b). For the sake of description, reference signs 303, 312, 316, 318, . . . in FIGS. 3 and 4 correspond to reference signs 3, 12, 16, 18, ... in FIG. 2. For the sake of illustration, in FIG. 3, an inclination is ignored of a side face of each of the first bank 323b and the second bank 323a. For the sake of illustration, FIG. 3 shows outlines of coatings 326b and 326a in a first inorganic sealing film, and outlines of coatings 328b and 328a in a second inorganic sealing film. These outlines are drawn for emphasis, and cannot actually be identified. For the sake of illustration, in FIG. 3(b), a thickness is ignored of each of a first inorganic sealing film 326 and a second inorganic sealing film 328.

As illustrated in FIGS. 3 and 4, the first bank 323b and the second bank 323a in the comparative example do not include a protrusion, and are formed to have a substantially constant cross-section. Hence, the first and second coatings 326b and 326a of the first inorganic sealing film 326 and the first and second coatings 328b and 328a of the second inorganic sealing film 328 do not include a protrusion either, and are formed to have a substantially constant cross-section.

The touch panel wires 332 are usually formed of a film of conductive material covering the whole sealing layer 306. The film of conductive material is etched to be the touch panel wires 332. This formation technique is likely to leave a residue of the conductive material around the touch panel wires 332 and in a recess of the sealing layer 306. The residue is likely to be left particularly in gaps, of the touch panel wires 332, in boundaries 398, 396, 394, and 392. The boundaries 398 and 396 are boundaries between a rising portion and an other portion of the second inorganic sealing film 328. The rising portion rises because of the first bank 323b. The boundaries 394 and 392 are boundaries between a rising portion and an other portion of the second inorganic sealing film 328. The rising portion rises because of the second bank 323a.

A problem of the display device according to the comparative example is that the residue electrically connects, and short-circuits, neighboring two of the touch panel wires 332. In order to prevent the short circuit, a planarization layer (not shown) could be provided on the sealing layer 306, and the touch panel wires 332 could be provided on the planarization layer. Such a structure, however, directly keeps the display device from being thinner.

First Embodiment

Figure 5:
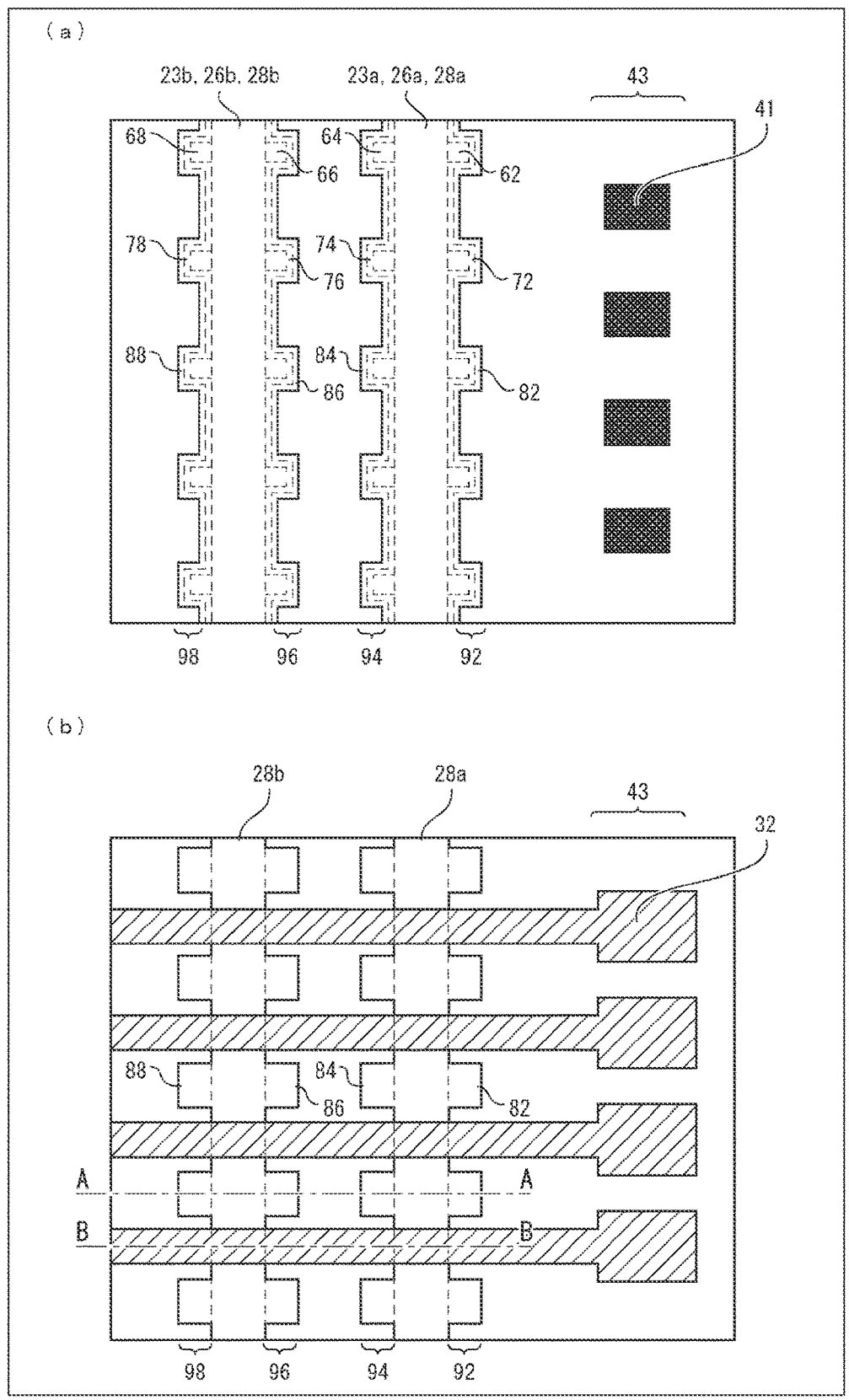
FIG. 5 is an illustration showing intersections, and their vicinities, of touch panel wires with a first bank and a second bank in a display device according to an embodiment of the present disclosure.
Figure 6:
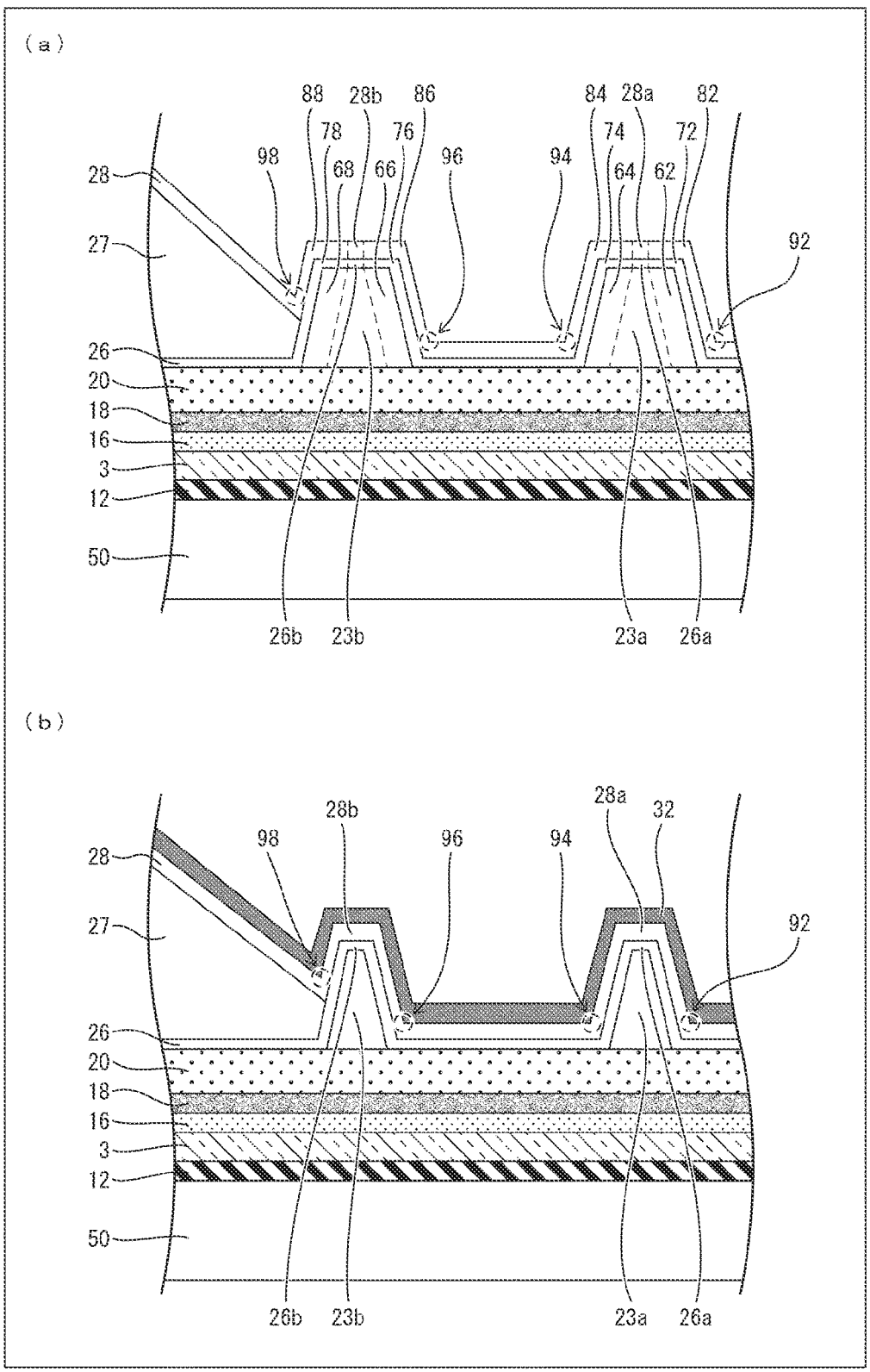
FIG. 6(a) is a cross-section taken along line A-A of FIG. 5(b)
FIG. 6(b) is a cross-section taken along line B-B of FIG. 5(b).

Described below is an embodiment of the present disclosure, with reference to FIGS. 5 and 8. FIG. 5 is an illustration showing intersections, and their vicinities, of the touch panel wires 32 with the first bank 23b and the second bank 23a in a display device according to this embodiment. FIG. 5(a) is a plan view schematically illustrating Step S5 of forming the sealing layer 6, and FIG. 5(b) is a plan view schematically illustrating Step S6 of forming the touch panel wires 32. FIG. 6(a) is a cross-section taken along line A-A of FIG. 5(b), and FIG. 6(b) is a cross-section taken along line B-B of FIG. 5(b). For the sake of illustration, in the plan view of FIG. 5 and similar plan views subsequent to FIG. 5, inclinations are ignored of side faces between: the first bank 23b and the second bank 23a; and bank protrusions 68, 66, 64, and 62. For the sake of illustration, the plan view of FIG. 5(a) and similar plan views subsequent to FIG. 5(a) show outlines of coatings 26b and 26a in the first inorganic sealing film 26, and outlines of coatings 28b and 28a in the second inorganic sealing film 28. These outlines are drawn for emphasis, and cannot actually be identified. For the sake of illustration, the plan view of FIG. 5(b) and similar plan views subsequent to FIG. 5(b) show the outlines of the coatings 28b and 28a in the second inorganic sealing film 28. The outline are drawn for emphasis, and cannot actually be identified. For the sake of illustration, in the plan view of FIG. 5 and similar plan views subsequent to FIG. 5, a thickness is ignored of each of the first inorganic sealing film 26 and the second inorganic sealing film 28.

As illustrated in FIG. 5(a), the second inorganic sealing film 28 according to this embodiment includes the first coating 28b (a bank coating) coating an upper face of the first bank 23b. The second inorganic sealing film 28 further includes, in a clearance between neighboring two of the touch panel wires 32, a first inner protrusion 88 protruding from the first coating 28b toward the display area, and a first outer protrusion 86 protruding from the first coating 28b away from the display area. In a similar manner, the second inorganic sealing film 28 includes the second coating 28a (a bank coating) coating an upper face of the second bank 23a. The second inorganic sealing film 28 further includes, in the clearance between the neighboring two of the touch panel wires 32, a second inner protrusion 84 protruding from the second coating 28a toward the display area, and a second outer protrusion 82 protruding from the second coating 28a away from the display area. Hereinafter, the first inner protrusion 88, the first outer protrusion 86, the second inner protrusion 84, and the second outer protrusion 82 are collectively referred to as protrusions 88, 86, 84, and 82. The scope of the present disclosure shall not be limited to the above structure. In the second inorganic sealing film 28, either the first coating 28b or the second coating 28a may be provided with a protrusion, and/or, the second inorganic sealing film 28 may include either an inner protrusion protruding toward the display area or an outer protrusion protruding away from the display area. For example, the second inorganic sealing film 28 may be provided only with the first inner protrusion 88 and the second outer protrusion 82.

The protrusions 88, 86, 84, and 82 of the second inorganic sealing film 28 are shaped into, but not limited to, a substantial rectangle in planar view. Alternatively, the protrusions 88, 86, 84, and 82 may be shaped into, for example, an other shape such as a substantial triangle or semicircle in planer view. A distance of the protrusions 88 and 86, of the second inorganic sealing film 28, protruding from the first bank 23b may be longer or shorter than a width of the first bank 23b. A distance of the protrusions 84 and 82, of the second inorganic sealing film 28, protruding from the second bank 23a may be longer or shorter than a width of the second bank 23a.

The above protrusions 88, 86, 84, and 82 of the second inorganic sealing film 28 preferably overlap with protrusions formed in the first inorganic sealing film 26. In this case, the first inorganic sealing film 26 includes the first coating 26b (a bank coating) coating the upper face of the first bank 23b. The first inorganic sealing film 26 further includes a first inner protrusion 78 protruding from the first coating 26b toward the display area, and a first outer protrusion 76 protruding from the first coating 26b away from the display area. In a similar manner, the first inorganic sealing film 26 includes the second coating 26a (a bank coating) coating the upper face of the second bank 23a. The first inorganic sealing film 26 further includes, in a clearance between neighboring two of the touch panel wires 32, the second inner protrusion 74 protruding from the second coating 26a toward the display area, and the second outer protrusion 72 protruding from the second coating 26a away from the display area. Hereinafter, the first inner protrusions 78, the first outer protrusion 76, the second inner protrusion 74, and the second outer protrusion 72 are collectively referred to as protrusions 78, 76, 74, and 72.

The protrusions 88, 86, 84, and 82 of the second inorganic sealing film 28 and the protrusions 78, 76, 74, and 72 of the first inorganic sealing film 26 preferably overlap with bank protrusions formed in the same layer as the first bank 23b and the second bank 23a. In this case, a first inner bank protrusion 68 is formed in the same layer as the first bank 23b to protrude, in a clearance between neighboring two of the touch panel wires 32, from the first bank 23b toward the display area. A first outer bank protrusion 66 is formed in the same layer as the first bank 23b to protrude, in a clearance between neighboring two of the touch panel wires 32, from the first bank 23b away from the display area. A second inner bank protrusion 64 is formed in the same layer as the second bank 23a to protrude, in a clearance between neighboring two of the touch panel wires 32, from the second bank 23a toward the display area. A second outer bank protrusion 62 is formed in the same layer as the second bank 23a to protrude, in the clearance between the neighboring two of the touch panel wires 32, from the second bank 23a away from the display area. Hereinafter, the first inner bank protrusion 68, the first outer bank protrusion 66, the second inner bank protrusion 64 and the second outer bank protrusion 62 are correctively referred to as the bank protrusions 68, 66, 64, and 62.

As can be seen, the bank protrusions 68, 66, 64, and 62 are formed in the same layer as the first bank 23b and the second bank 23a, and the protrusions 78, 76, 74, and 72 of the first inorganic sealing film 26 and the protrusions 88, 86, 84, and 82 of the second inorganic sealing film 28 overlap with the bank protrusions 68, 66, 64, and 62. Such features are preferable because the protrusions 88, 86, 84, and 82 of the second inorganic sealing film 28 can be formed without increasing the number of staking layers.

Note that the scope of the present disclosure shall not be limited to such features. The bank protrusions 68, 66, 64, and 62 may be formed below or above the first bank 23b and the second bank 23a. The protrusions 88, 86, 84, and 82 of the second inorganic sealing film 28 do not have to be supported by the protrusions 78, 76, 74, and 72 of the first inorganic sealing film 26. The protrusions 78, 76, 74, and 72 of the first inorganic sealing film 26 do not have to be supported by the bank protrusions 68, 66, 64, and 62. The protrusions 88, 86, 84, and 82 of the second inorganic sealing film 28 may be configured in, and supported by, any given manner as long as each path, of the protrusions 88, 86, 84, and 82, along the boundaries 98, 96, 94, and 92 in a clearance between two of neighboring touch panel wires 32, is longer than a liner distance between the touch panel wires 32.

Three-Dimensional Shapes of Bank Protrusions

Figure 7:
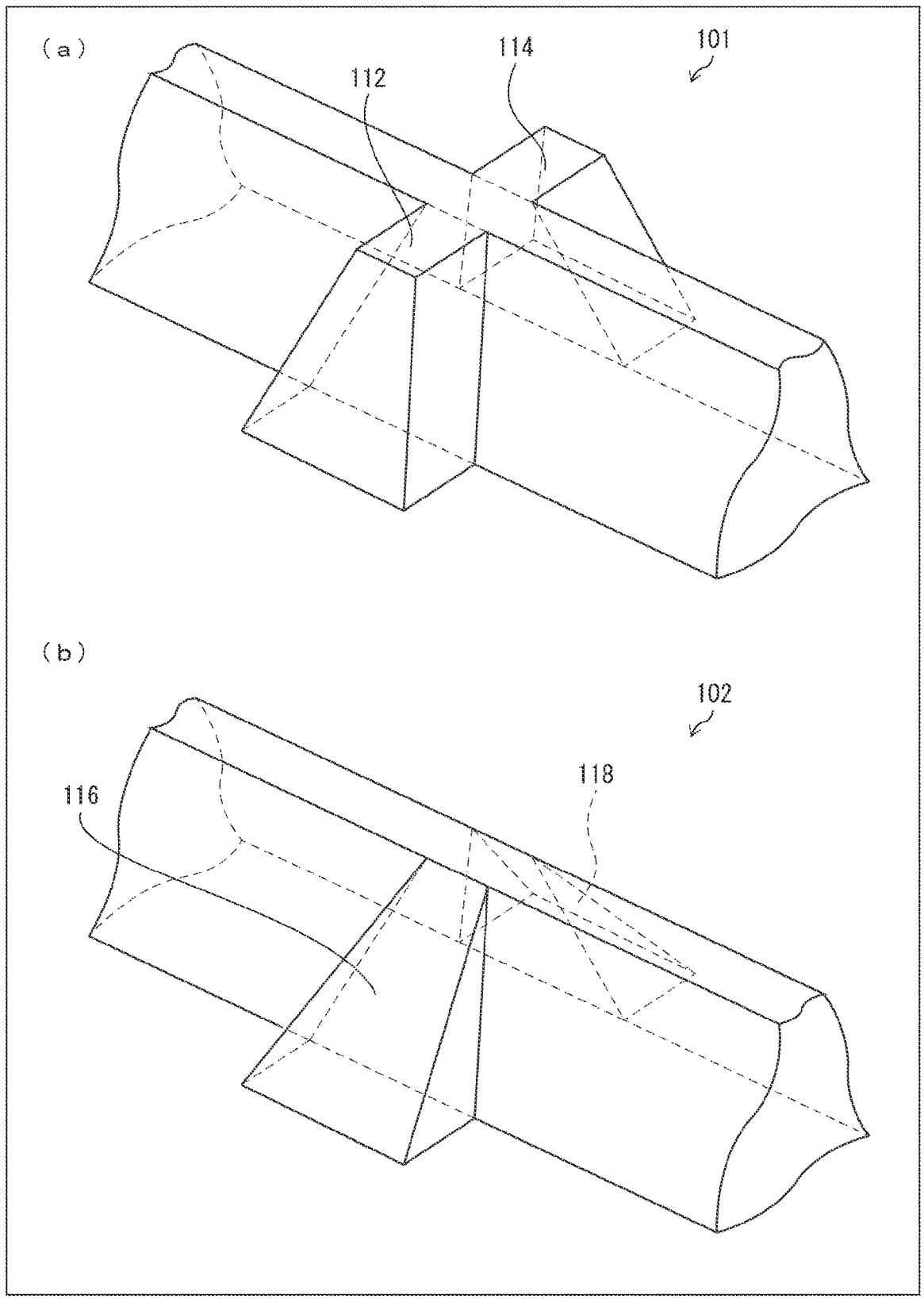
FIG. 7 partially illustrates examples of three-dimensional shapes of bank protrusions shown in FIG. 5.

FIG. 7 partially illustrates examples of three-dimensional shapes of the bank protrusions 68, 66, 64, and 62 shown in FIG. 5.

As illustrated in FIG. 7(a), bank protrusions 112 and 114 are formed on a bank 101 with each having an upper face horizontally protruding from an upper face of the bank 101. Moreover, as illustrated in FIG. 7(b), bank protrusions 116 and 118 are formed on a bank 102 with each having an upper face protruding with a descending slope from an upper face of the bank 102.

Each of the bank protrusions 68, 66, 64, and 62 according to this embodiment may be shaped into the same three-dimensional shape as that of any one of the bank protrusions 112, 114, 116, and 118 illustrated in FIG. 7. The three-dimensional shape of the bank protrusions 68, 66, 64, and 62 may be a combination of, or an intermediate shape between, the bank protrusions 112 and 114 and the bank protrusions 116 and 118, or any other given three-dimensional shape. Each of the bank protrusions 68, 66, 64, and 62 may be shaped into a different shape. The three-dimensional shape of the bank protrusions 68, 66, 64, and 62 shall not be limit to a substantial rectangle in planar view, and, for example, may be shaped into an other shape such as a substantial triangle or semicircle in planer view.

Arrangement of Bank Protrusions in Planer View

In FIG. 5(b), the first inner protrusion 88 and the first outer protrusion 86 of the second inorganic sealing film 28 are arranged axisymmetrically in planar view with respect to the first bank 23b. In a similar manner, the second inner protrusion 84 and the second outer protrusion 82 are arranged axisymmetrically in planar view with respect to the second bank 23a. The scope of this embodiment shall not be limited to such arrangements. As illustrated in FIG. 8, the first inner protrusion 88 and the first outer protrusions 86 may be arranged asymmetrically in planar view with respect to the first bank 23b, and the second inner protrusion 84 and the second outer protrusion 82 may be arranged asymmetrically in planner view with respect to the second bank 23a.

Figure 8:
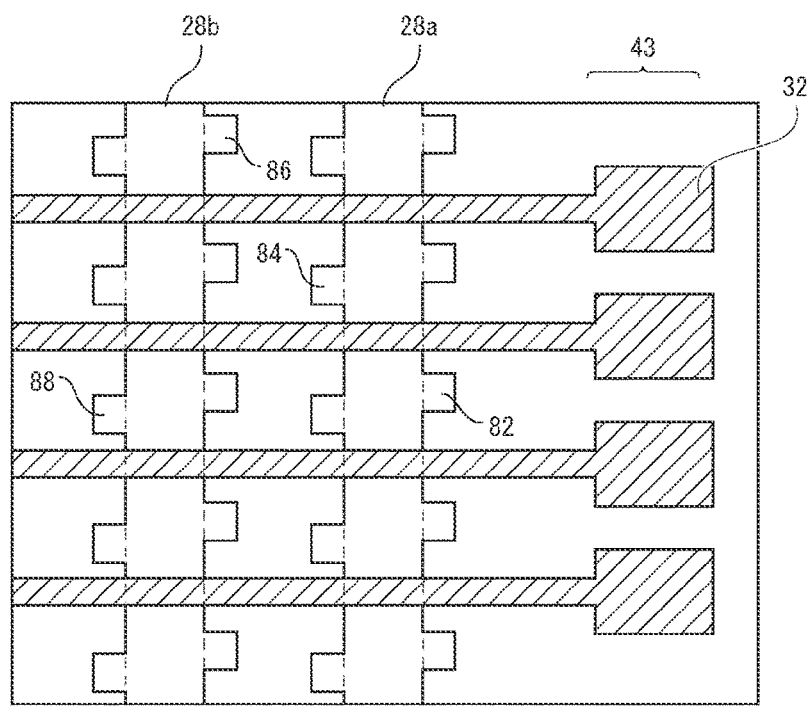
FIG. 8 is a plan view illustrating an other example of how to arrange protrusions of a second inorganic sealing film illustrated in FIG. 5.

As illustrated in FIG. 5(b) and FIG. 8, the protrusions 88, 86, 84, and 82 of the second inorganic sealing film 28 according to this embodiment are arranged not to intersect with the touch panel wires 32. Accordingly, the protrusions 88, 86, 84, and 82 may be arranged not asymmetrically as shown in FIG. 8 but symmetrically as shown in FIG. 5(b) in order to leave a clearance between the touch panel wires 32 and the protrusions 88, 86, 84, and 82. FIG. 8 is a plan view illustrating a modification of the arrangement of the protrusions 88, 86, 84, and 82 of the second inorganic sealing film 28 according to this embodiment.

Advantageous Effects

In the display device 2 according to this embodiment, the first inner protrusion 88 and the first outer protrusion 86 of the second inorganic sealing film 28 are provided in an intersection of the first bank 23b with neighboring two of the touch panel wires 32. In a similar manner, the second inner protrusion 84 and the second outer protrusion 82 of the second inorganic sealing film 28 are provided in an intersection of the second bank 23a with the neighboring two of the touch panel wires 32. Hence, each path between the two touch panel wires 32 along the boundaries 98, 96, 94, and 92 is longer than a liner distance between the two touch panel wires 32. The boundaries 98 and 96 are boundaries between a rising portion and an other portion of the second inorganic sealing film 28. The rising portion rises because of the first bank 23b, the first inner bank protrusion 68, and the first outer bank protrusion 66. The boundaries 94 and 92 are boundaries between a rising portion and an other portion of the second inorganic sealing film 28. The rising portion rises because of the second bank 23a, the second inner bank protrusion 64, and the second outer bank protrusion 62. The chance that the residue is interrupted is higher as the path is longer. That is why neighboring two of the touch panel wires 32 are lower in the risk of a short circuit through the residue, in the configuration illustrated in FIG. 5 according to this embodiment than in the configuration illustrated in FIG. 3 according to the comparative example.

Hence, in the display device 2 according to this embodiment, the neighboring touch panel wires 32 can be kept from a short circuit when the touch panel wires 32 run directly on the sealing layer 6. Such features make it possible to thin the display device 2 in the on-cell configuration in which the touch panel function layer 30 is directly provided on the sealing layer 6, and also to keep neighboring touch panel wires from a short circuit.

Second Embodiment

Figure 9:
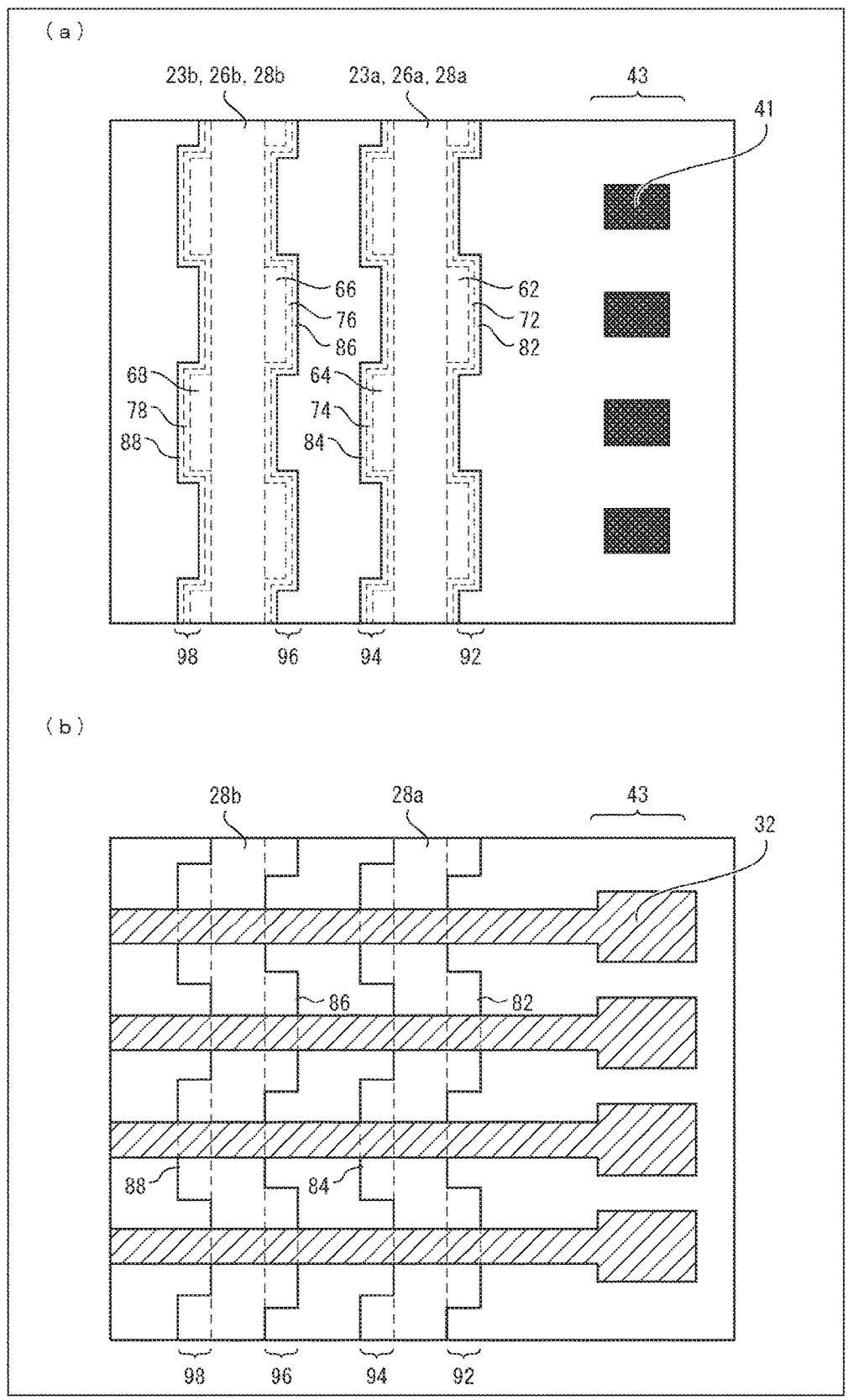
FIG. 9 is an illustration showing intersections, and their vicinities, of the touch panel wires with the first bank and the second bank in the display device according to an other embodiment of the present disclosure.

Described below is an other embodiment of the present disclosure, with reference to FIGS. 9 to 11. FIG. 9 is an illustration showing intersections, and their vicinities, of the touch panel wires 32 with the first bank 23b and the second bank 23a in the display device according to an other embodiment of the present disclosure. FIG. 9(a) is a plan view schematically illustrating Step S5 of forming the sealing layer 6, and FIG. 9(b) is a plan view schematically illustrating Step S6 of forming the touch panel wires 32.

As illustrated in FIG. 9(a), the second inorganic sealing film 28 according to this embodiment includes: the first coating 28b; the first inner protrusion 88; and the first outer protrusion 86. In a similar manner, the second inorganic sealing film 28 includes: the second coating 28a; the second inner protrusion 84; and the second outer protrusion 82.

In FIG. 9(b), the first inner protrusion 88 and the first outer protrusion 86 of the second inorganic sealing film 28 are arranged asymmetrically in planar view with respect to the first bank 23b. In a similar manner, the second inner protrusion 84 and the second outer protrusion 82 are arranged asymmetrically in planar view with respect to the second bank 23a. The scope of this embodiment shall not be limited to such arrangements. As illustrated in FIG. 10, the first inner protrusion 88 and the first outer protrusions 86 may be arranged symmetrically in planar view with respect to the first bank 23b, and the second inner protrusion 84 and the second outer protrusion 82 may be arranged symmetrically in planner view with respect to the second bank 23a.

Figure 10:
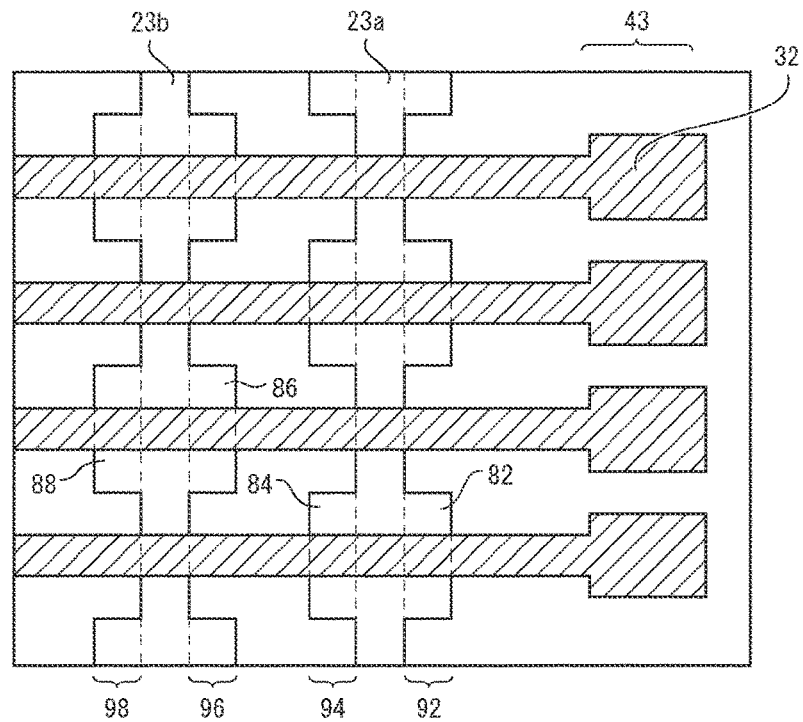
FIG. 10 is a plan view illustrating an other example of how to arrange the protrusions of the second inorganic sealing film illustrated in FIG. 9.
Figure 11:
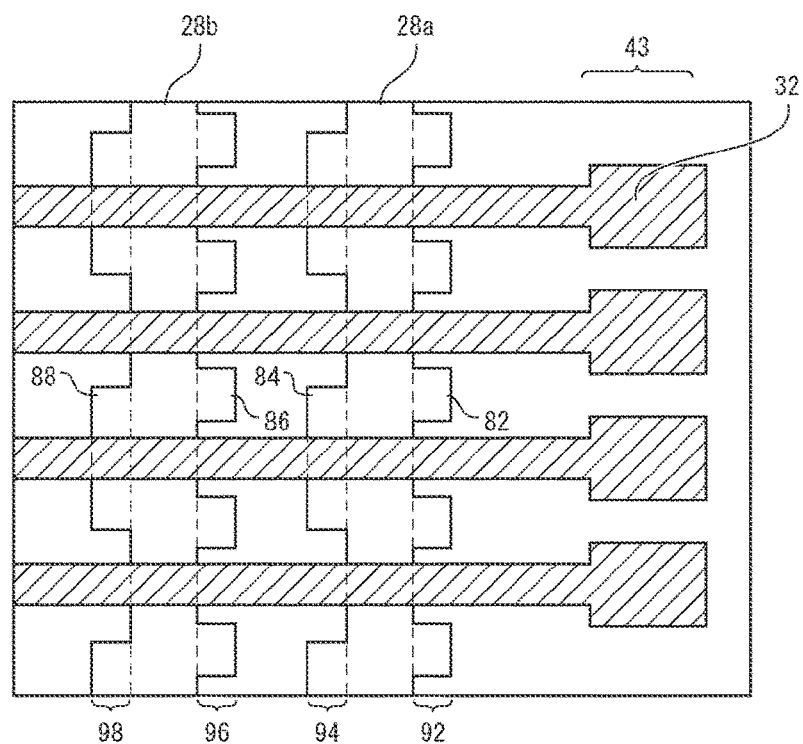
FIG. 11 is a plan view illustrating an arrangement example in combination of an arrangement of outer protrusions of the second inorganic sealing film in FIG. 5 and an arrangement of inner protrusions of the second inorganic sealing film in FIG. 9.

As illustrated in FIG. 9(b) and FIG. 10, the protrusions 88, 86, 84, and 82 of the second inorganic sealing film 28 according to this embodiment are arranged to intersect with one of the touch panel wires 32 alone. The scope of the present disclosure shall not be limited to such arrangements. As illustrated in, for example, FIG. 11, the first and second embodiments may be combined such that one of the first inner protrusion 88 and the first outer protrusion 86 may be disposed not to intersect with the touch panel wires 32, and an other one of the first inner protrusion 88 and the first outer protrusion 86 may be disposed to intersect with one of the touch panel wires 32 alone. Alternatively, one of the second inner protrusion 84 and the second outer protrusion 82 may be disposed not to intersect with the touch panel wires 32, and an other one of the second inner protrusion 84 and the second outer protrusion 82 may be disposed to intersect with one of the touch panel wires 32 alone. FIG. 11 is a plan view showing an arrangement example in combination of an arrangement of the outer protrusions 86 and 82 of the second inorganic sealing film 28 illustrated in FIG. 5 and an arrangement of the inner protrusions 88 and 84 of the second inorganic sealing film 28 illustrated in FIG. 9.

Advantageous Effects

As can be seen in the display device 2 according to the first embodiment, the above features make it possible to thin the display device 2 according to this embodiment, and also to keep neighboring touch panel wires from a short circuit.

Third Embodiment

Figure 12:
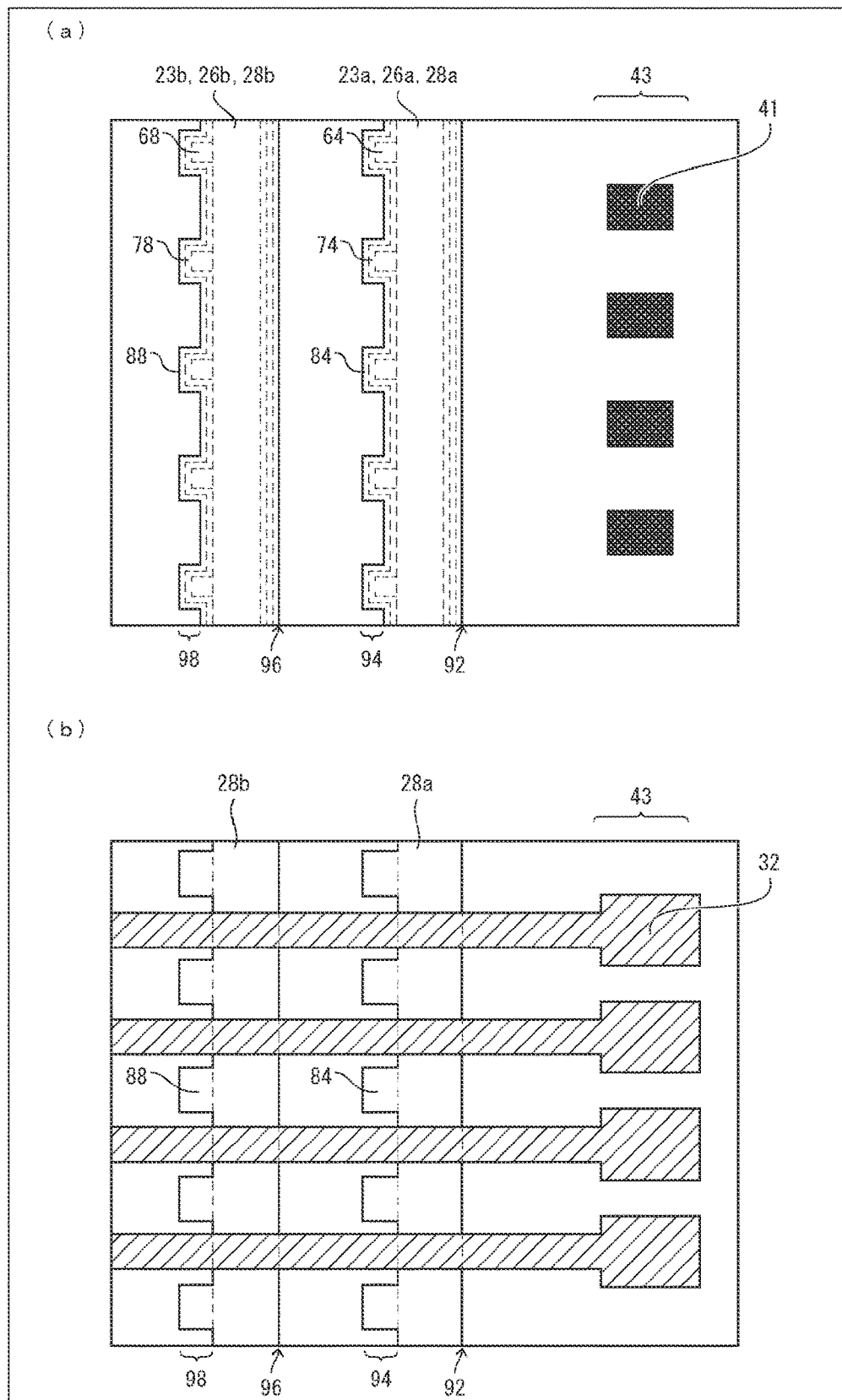
FIG. 12 is an illustration showing intersections, and their vicinities, of the touch panel wires with the first bank and the second bank in the display device according to still an other embodiment of the present disclosure.
Figure 13:
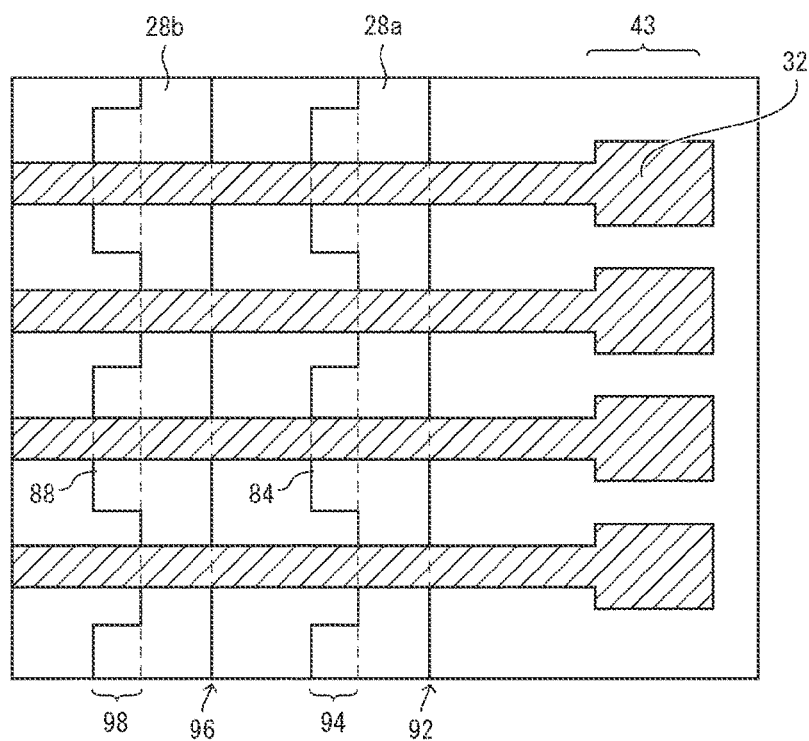
FIG. 13 is a plan view illustrating an other example of how to arrange inner protrusions of the second inorganic sealing film illustrated in FIG. 12.

Described below is still an other embodiment of the present disclosure, with reference to FIGS. 12 and 13. FIG. 12 is an illustration showing intersections, and their vicini-ties, of the touch panel wires 32 with the first bank 23b and the second bank 23a in the display device according to still an other embodiment of the present disclosure. FIG. 12(a) is a plan view schematically illustrating Step S5 of forming the sealing layer 6, and FIG. 12(b) is a plan view schematically illustrating Step S6 of forming the touch panel wires 32.

As illustrated in FIG. 12(a), the second inorganic sealing film 28 according to this embodiment includes the first coating 28b and the first inner protrusion 88, but not the first outer protrusion 86. In a similar manner, the second inorganic sealing film 28 includes the second coating 28a and the second inner protrusion 84, but not the second outer protrusion 82.

As illustrated in FIG. 12(b), the first inner protrusion 88 and the second inner protrusion 84 of the second inorganic sealing film 28 according to this embodiment are arranged not to intersect with the touch panel wires 32. The scope of this embodiment shall not limited to such an arrangement. Alternatively, as illustrated in FIG. 13, the first inner protrusion 88 and the second inner protrusion 84 may be arranged to intersect with one of the touch panel wires 32 alone. Moreover, although not shown, one of the first inner protrusion 88 and the second inner protrusion 84 may be disposed not to intersect with the touch panel wires 32, and an other one of the first inner protrusion 88 and the second inner protrusion 84 may be disposed to intersect with one of the touch panel wires 32 alone.

Advantageous Effects

As can be seen in the display device 2 according to the first and second embodiments, the above features make it possible to thin the display device 2 according to this embodiment, and also to keep neighboring touch panel wires from a short circuit.

Fourth Embodiment

Figure 14:
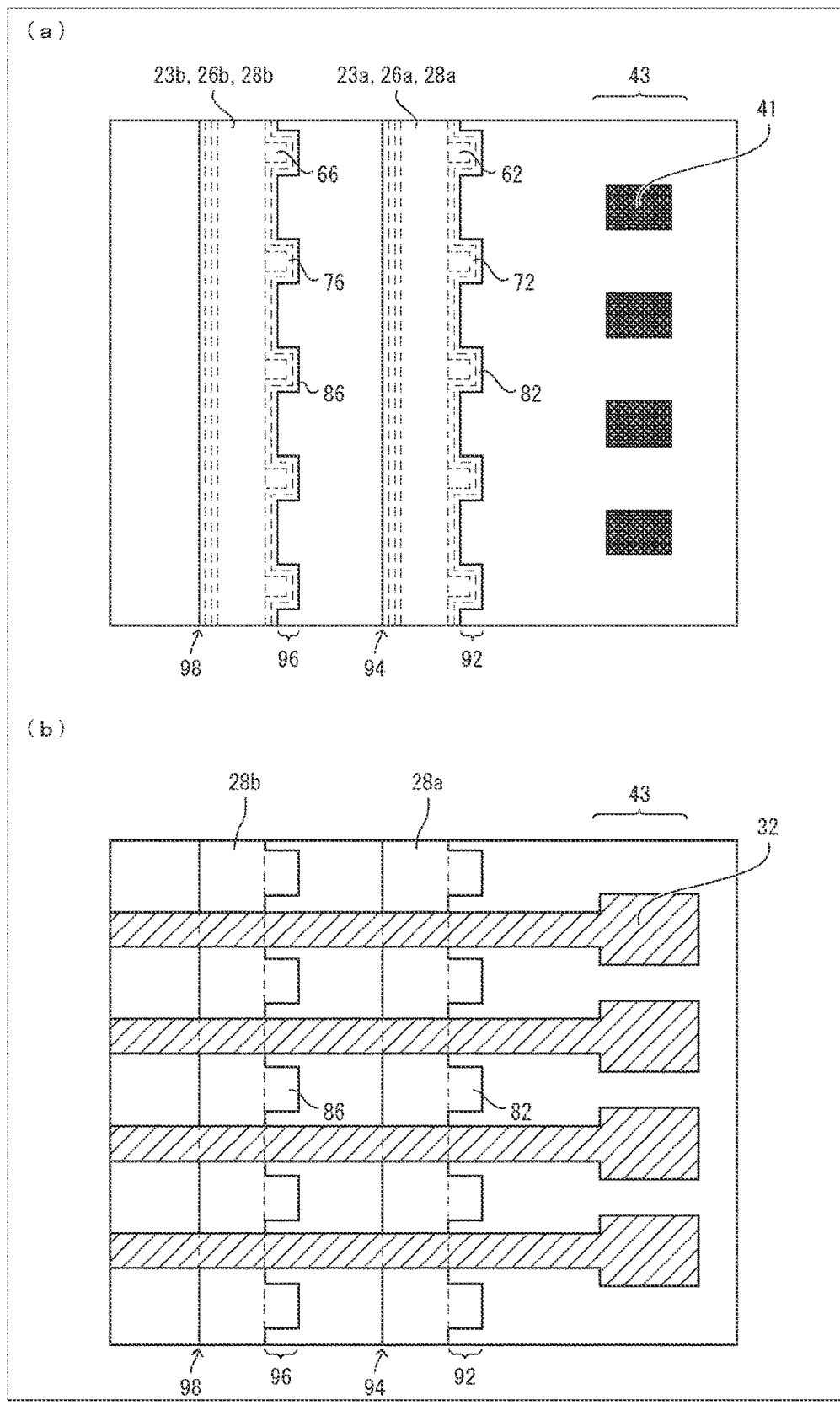
FIG. 14 is an illustration showing intersections, and their vicinities, of the touch panel wires with the first bank and the second bank in the display device according to still an other embodiment of the present disclosure.
Figure 15:
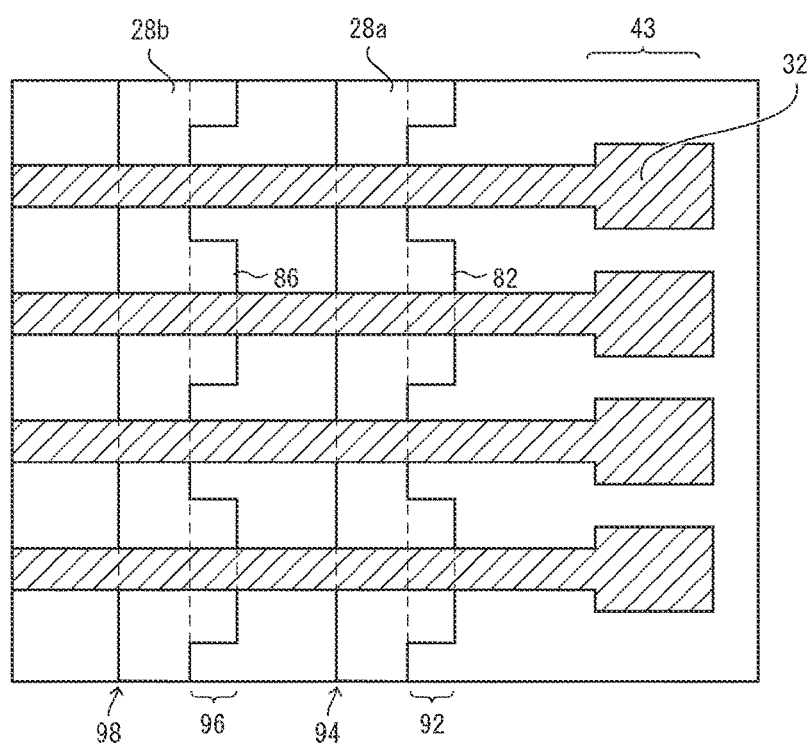
FIG. 15 is a plan view illustrating an other example of how to arrange outer protrusions of the second inorganic sealing film illustrated in FIG. 14.

Described below is still an other embodiment of the present disclosure, with reference to FIGS. 14 and 15. FIG. 14 is an illustration showing intersections, and their vicinities, of the touch panel wires 32 with the first bank 23b and the second bank 23a in the display device according to still an other embodiment of the present disclosure. FIG. 14(a) is a plan view schematically illustrating Step S5 of forming the sealing layer 6, and FIG. 14(b) is a plan view schematically illustrating Step S6 of forming the touch panel wires 32.

As illustrated in FIG. 14(a), the second inorganic sealing film 28 according to this embodiment includes the first coating 28b and the first outer protrusion 86, but not the first inner protrusion 88. In a similar manner, the second inorganic sealing film 28 includes the second coating 28a and the second outer protrusion 82, but not the second outer protrusion 84.

As illustrated in FIG. 14(b), the first outer protrusion 86 and the second outer protrusion 82 of the second inorganic sealing film 28 according to this embodiment are arranged not to intersect with the touch panel wires 32. The scope of this embodiment shall not limited to such an arrangement. Alternatively, as illustrated in FIG. 15, the first outer protrusion 86 and the second outer protrusion 82 may be arranged to intersect with one of the touch panel wires 32 alone. Moreover, although not shown, one of the first inner protrusion 88 and the second inner protrusion 84 may be disposed not to intersect with the touch panel wires 32, and an other one of the first inner protrusion 88 and the second inner protrusion 84 may be disposed to intersect with one of the touch panel wires 32 alone.

Advantageous Effects

As can be seen in the display device 2 according to the first to third embodiments, the above features make it possible to thin the display device 2 according to this embodiment, and also to keep neighboring touch panel wires from a short circuit.

Additional Remarks

The display devices of the embodiments can be used as flexible displays. These flexible displays may be of any given type as long as they are flexible and include bendable display elements. As described before, the light-emitting element ES includes two kinds of display elements: one of which has brightness and transmittance controlled by current, and an other one of which by voltage. Display elements to be controlled by current are used for such a display as an organic EL display including OLEDs, an EL display such as an inorganic EL display including inorganic light-emitting diodes, or a QLED display including QLEDs. Moreover, display elements controlled by voltage include liquid crystal display elements.

SUMMARY

A display device according a first aspect of the present disclosure includes a display area and a frame area surrounding the display area. The display device includes: a light-emitting element layer formed above the TFT layer; a sealing layer formed above the light-emitting element layer, and including a first inorganic sealing film, an organic sealing film, and a second inorganic sealing film stacked on top of an other in a stated order; a bank formed to surround the display area, and coated with the first inorganic sealing film and the second inorganic sealing film; a touch panel function layer formed above the sealing layer; and a plurality of touch panel wires formed above the sealing layer, running to intersect with the bank in planar view, and connected to the touch panel function layer. The second inorganic sealing film includes: a bank coating coating an upper face of the bank; and a protrusion in a clearance between neighboring two of the touch panel wires. The protrusion protrudes from the bank coating toward the display area or away from the display area.

In the display device, of the first aspect, according to a second aspect of the present disclosure, the first inorganic sealing film may include an other protrusion with which the protrusion of the second inorganic sealing film overlaps.

In the display device, of the second aspect, according to a third aspect of the present disclosure, the first inorganic sealing film may include: an other bank coating coating the upper face of the bank; and the other protrusion in the clearance between the neighboring two of the touch panel wires. The other protrusion may protrude, from the other bank coating of the first inorganic sealing film, toward the display area or away from the display area.

The display device, of the second aspect, according to a fourth aspect of the present disclosure may further include a bank protrusion formed in the same layer as the bank. The other protrusion of the first inorganic sealing film and the protrusion of the second inorganic sealing film may overlap with the bank protrusion.

In the display device, of the fourth aspect, according to a fifth aspect of the present disclosure, in the clearance between the neighboring two of the touch panel wires, the bank protrusion may be formed to protrude from the bank toward the display area or away from the display area.

In the display device, of the first aspect, according to a sixth aspect of the present disclosure, the bank may include a plurality of banks. The banks may include: a first bank defining an end of the organic sealing film; and a second bank provided to surround the first bank. For each of the first bank and the second bank, the second inorganic sealing film may include the bank coating and the protrusion.

In the display device, of the first aspect, according to a seventh aspect of the present disclosure, the protrusion of the second inorganic sealing film may include a plurality of protrusions. The protrusions of the second inorganic sealing film may include: an inner protrusion protruding toward the display area; and an outer protrusion protruding away from the display area.

In the display device, of the seventh aspect, according to an eight aspect of the present disclosure, the inner protrusion and the outer protrusion may be arranged symmetrically in planar view with respect to the bank.

In the display device, of the seventh aspect, according to a ninth aspect of the present disclosure, the inner protrusion and the outer protrusion may be arranged asymmetrically in planar view with respect to the bank.

In the display device, of the seventh aspect, according to a tenth aspect of the present disclosure, at least one of the inner protrusion and the outer protrusion may be disposed not to intersect with the touch panel wires.

In the display device, of the seventh aspect, according to an eleventh aspect of the present disclosure, at least one of the inner protrusion and the outer protrusion may be disposed to intersect with one of the touch panel wires alone.

In the display device, of the first aspect, according to a twelfth aspect of the present disclosure, the protrusion of the second inorganic sealing film may protrude toward the display area.

In the display device, of the first aspect, according to a thirteenth aspect of the present disclosure, the protrusion of the second inorganic sealing film may protrude away from the display area.

In the display device, of the twelfth aspect or the thirteenth aspect, according to a fourteenth aspect of the present disclosure, the protrusion may be disposed not to intersect with the touch panel wires.

In the display device, of the twelfth aspect or the thirteenth aspect, according to a fifteenth aspect of the present disclosure, the protrusion may be disposed to intersect with one of the touch panel wires alone.

In the display device, of the first aspect, according to a sixteenth aspect of the present disclosure, the touch panel wires may be formed either: in the same layer as a wire or an electrode for the touch panel function layer; or in a layer, different from the touch panel function layer, across an inorganic insulating film from the touch panel function layer.

In the display device, of any one of the first to sixteenth aspects, according to a seventeenth aspect of the present disclosure, each of the touch panel wires may be a monolayer wire made of a single metal selected from a group including such metals as copper, aluminum, molybdenum, titanium, tantalum, and tungsten, or a multilayer wire made of two or more of the metals selected from the group.

The display device, of any one of the first to seventeenth aspects, according to an eighteenth aspect may further include a terminal unit provided in the frame area. At the terminal unit, each of the touch panel wires may be connected to a routed wire formed in the same layer as a wire used for the TFT layer.

In the display device, of the eighteenth aspect, according to a nineteenth aspect of the present disclosure, the routed wire may include a terminal provided to the terminal unit, and the terminal may be coated directly with the touch panel wire.

In the display device, of the eighteenth aspect, according to a twentieth aspect of the present disclosure, the terminal unit may be positioned out of an area in which the sealing layer is formed in planar view.

The present disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the present disclosure. Moreover, the technical aspects disclosed in each embodiment may be combined to achieve a new technical feature.

The invention claimed is:

1. A display device including a display area and a frame area surrounding the display area, the display device comprising:
    a TFT layer;
    a light-emitting element layer formed above the TFT layer;
    a sealing layer formed above the light-emitting element layer, and including a first inorganic sealing film, an organic sealing film, and a second inorganic sealing film stacked on top of an other in a stated order;
    a bank formed to surround the display area, and coated with the first inorganic sealing film and the second inorganic sealing film;
    a touch panel function layer formed above the sealing layer; and
    a plurality of touch panel wires formed above the sealing layer, running to intersect with the bank in planar view, and connected to the touch panel function layer,
    the second inorganic sealing film including:
        a bank coating coating an upper face of the bank; and
        a protrusion in a clearance between neighboring two of the plurality of touch panel wires, the protrusion protruding from the bank coating toward the display area or away from the display area;
    wherein the bank further includes a bank protrusion formed in the same layer as the bank.

2. The display device according to claim 1, wherein the first inorganic sealing film includes an other protrusion with which the protrusion of the second inorganic sealing film overlaps.

3. The display device according to claim 2, wherein the first inorganic sealing film includes:
    an other bank coating coating the upper face of the bank; and
    the other protrusion in the clearance between the neighboring two of the plurality of touch panel wires, the other protrusion protruding, from the other bank coating of the first inorganic sealing film, toward the display area or away from the display area.

4. The display device according to claim 1, wherein an other protrusion of the first inorganic sealing film and the protrusion of the second inorganic sealing film overlap with the bank protrusion.

5. The display device according to claim 4, wherein in the clearance between the neighboring two of the plurality of touch panel wires, the bank protrusion is formed to protrude from the bank toward the display area or away from the display area.

6. The display device according to claim 1, wherein the bank includes a plurality of banks,
    the plurality of banks include: a first bank defining an end of the organic sealing film; and a second bank provided to surround the first bank, and
    for each of the first bank and the second bank, the second inorganic sealing film includes the bank coating and the protrusion.

7. The display device according to claim 1, wherein the protrusion of the second inorganic sealing film includes a plurality of protrusions,
    the plurality of protrusions of the second inorganic sealing film include:
        an inner protrusion protruding toward the display area; and
        an outer protrusion protruding away from the display area.

8. The display device according to claim 7, wherein the inner protrusion and the outer protrusion are arranged symmetrically in planar view with respect to the bank.

9. The display device according to claim 7, wherein the inner protrusion and the outer protrusion are arranged asymmetrically in planar view with respect to the bank.

10. The display device according to claim 7, wherein at least one of the inner protrusion and the outer protrusion is disposed not to intersect with the plurality of touch panel wires.

11. The display device according to claim 7, wherein at least one of the inner protrusion and the outer protrusion is disposed to intersect with one of the plurality of touch panel wires alone.

12. The display device according to claim 1, wherein the protrusion of the second inorganic sealing film protrudes toward the display area.

13. The display device according to claim 1, wherein the protrusion of the second inorganic sealing film protrudes away from the display area.

14. The display device according to claim 12, wherein the protrusion is disposed not to intersect with the plurality of touch panel wires.

15. The display device according to claim 12, wherein the protrusion is disposed to intersect with one of the plurality of touch panel wires alone.

16. The display device according to claim 1, wherein the plurality of touch panel wires are formed either:
    in the same layer as a wire or an electrode for the touch panel function layer; or
    in a layer, different from the touch panel function layer, across an inorganic insulating film from the touch panel function layer.

17. The display device according to claim 1, wherein each of the plurality of touch panel wires is a monolayer wire made of a single metal selected from a group including such metals as copper, aluminum, molybdenum, titanium, tantalum, and tungsten, or a multilayer wire made of two or more of the metals selected from the group.

18. The display device according to claim 1, further comprising
    a terminal unit provided in the frame area, wherein
    at the terminal unit, each of the plurality of touch panel wires is connected to a routed wire formed in the same layer as a wire used for the TFT layer.

19. The display device according to claim 18, wherein the routed wire includes a terminal provided to the terminal unit, and
    the terminal is coated directly with the touch panel wire.

20. The display device according to claim 18, wherein the terminal unit is positioned out of an area in which the sealing layer is formed in planar view.

\* \* \* \* \*